United States Patent
Uhlig et al.

(10) Patent No.: US 7,408,185 B2
(45) Date of Patent: Aug. 5, 2008

(54) ORGANIC LIGHT EMITTING DEVICE AND DISPLAY USING THE SAME

(75) Inventors: Albrecht Uhlig, Berlin (DE); Thomas Schrader, Berlin (DE)

(73) Assignee: Samsung SDI Co., Ltd., Suwon (KR)

(*) Notice: Subject to any disclaimer, the term of this patent is extended or adjusted under 35 U.S.C. 154(b) by 239 days.

(21) Appl. No.: 10/961,234

(22) Filed: Oct. 12, 2004

(65) Prior Publication Data

US 2005/0093440 A1 May 5, 2005

(30) Foreign Application Priority Data

Oct. 29, 2003 (DE) ............... 103 51 822
Feb. 18, 2004 (KR) .............. 10-2004-0010606

(51) Int. Cl.
*H01L 51/52* (2006.01)
*H01L 51/54* (2006.01)

(52) U.S. Cl. ............... 257/40; 257/79; 257/98; 257/E51.018; 257/E51.028

(58) Field of Classification Search ........... 257/40, 257/79, 82, 184, 290, 257, 292, 98, E51.018, 257/E51.028

See application file for complete search history.

(56) References Cited

U.S. PATENT DOCUMENTS

| 4,885,211 A | 12/1989 | Tang et al. .............. 428/457 |
| 5,061,569 A | 10/1991 | VanSlyke et al. ........... 428/457 |
| 2002/0053871 A1* | 5/2002 | Seo .............. 313/504 |

FOREIGN PATENT DOCUMENTS

| KR | 10-2001-0095429 | 11/2001 |
| WO | 03-001569 | 1/2003 |

OTHER PUBLICATIONS

D. Braun, et al., Visible Light Emission from Semiconducting Polymer Diodes; Appl. Phys. Lett. 58 (18), May 6, 1991, pp. 1982-1984.

* cited by examiner

*Primary Examiner*—Evan Pert
(74) *Attorney, Agent, or Firm*—H.C. Park & Associates, PLC

(57) ABSTRACT

An organic light emitting device (OLED) comprising an anode, an organic emissive layer, a cathode, and an ion-complexing material layer, and a display using the OLED, are provided. The ion-complexing material layer is arranged between the anode and the cathode.

40 Claims, 2 Drawing Sheets

ORGANIC LIGHT EMITTING DEVICE AND DISPLAY USING THE SAME

This application claims the benefit of German Patent Application No. 103 51 822.3, filed on Oct. 29, 2003, in the German Intellectual Property Office, and Korean Patent Application No. 2004-10606, filed on Feb. 18, 2004, in the Korean Intellectual Property Office, which are hereby incorporated by reference for all purposes as if fully set forth herein.

BACKGROUND OF THE INVENTION

1. Field of the Invention

The present invention relates to an organic light emitting device and a display using the same.

2. Discussion of the Related Art

A structural element of an organic light emitting device (organic light emitting diode; OLED) operates based on the principle of electroluminescence. Electrons and holes are injected into a semiconductor material so that they recombine and become electrically neutral. Excited molecules derived from, for example, polyflourenes, generate light when they transit back to the base state. Various known organic compounds for OLEDs may be classified into small molecular weight compounds (SM-OLEDs) and polymeric organic compounds (pLEDs).

Various phenomena, for example, electron conduction (electron transport), hole conduction, and light emission, are involved in the operational efficiency of the OLED, which is defined as the ratio of the amount of emitted light to injected charge carriers. Most materials used in OLEDs are responsible for one of the phenomena, i.e., electron conduction, hole conduction, and light emission. Use of multi-layered structural elements, which are combined together, has been suggested for higher efficiency. In this structure, one layer plays may play a prominent part in conducting holes while another layer in conducting electrons. These multiple layers may be arranged in a predetermined manner for an OLED with higher energy efficiency. Methods of arranging specific material layers for a higher OLED are disclosed in various references.

U.S. Pat. No. 4,885,211 discloses an increase in the efficiency of an SM-OLED by improved injection of electrons into a cathode. In a similar approach, use of a metal having a minor outlet work for the cathode is suggested in Appl. Phys. Lett., 1991, 58, 1992 (Heger et al.).

U.S. Pat. No. 5,061,569 discloses an increase in the efficiency of an SM-OLED by improved injection and conduction of holes. A specific layer made of tertiary amines is used to lower energy barriers between structural elements of the OLED, thus improving hole injection and conduction.

WO 2003001569 A2 (Princeton University) discloses an OLED with a structure including an anode, a polymeric hole transport layer and emissive layer, a low molecular weight exiton blocking layer, a low molecular weight electron-conducting layer, and a cathode. Polyvinylkarbazol (PVK) is used as a hole conductor in the OLED. To obtain a full color display, the PVK layer is doped with luminescent coloring materials to define green, red, and blue spectrum areas thereon. Furthermore, an exiton blocking layer made of a low molecular weight material is disposed between the PVK layer and the cathode.

Although the efficiency of the structural layers of the OLED may be improved, the OLED may require a high energy input for a predetermined level of brightness, and it may have a short life span due to poor durability.

SUMMARY OF THE INVENTION

Accordingly, the present invention is directed to an organic light emitting device and a display using the same that substantially obviates one or more of the problems due to limitations and disadvantages of the related art.

The present invention provides a structural element of an organic light-emitting device (organic light emitting diode; OLED) and a display using the OLED.

Additional features of the invention will be set forth in the description which follows, and in part will be apparent from the description, or may be learned by practice of the invention.

The present invention discloses an OLED comprising an anode, a cathode, and an organic emissive layer disposed between the anode and the cathode. An ion-complexing material layer is also disposed between the anode and the cathode.

The present invention also discloses an OLED comprising an anode, a cathode, and an organic emissive layer disposed between the anode and the cathode. An ion-complexing material layer is also disposed between the anode and the cathode.

The present invention also discloses an apparatus for suppressing ion migration into an organic emissive layer, comprising an ion-complexing material layer disposed between an anode and a cathode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Reference will now be made in detail to an embodiment of the present invention, example of which is illustrated in the accompanying drawings.

Figure 1:
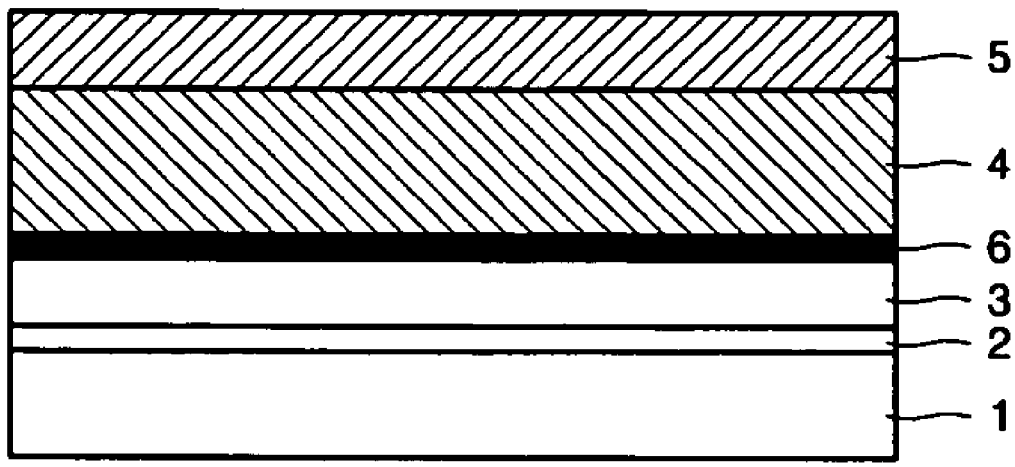
FIG. 1 shows a structural element of an OLED according to a first exemplary embodiment of the present invention.

Referring to FIG. 1, a structural element of an OLED according to a first exemplary embodiment of the present invention includes a substrate 1, an anode 2, an optional hole transport layer (HTL) 3, an organic emissive layer 4, a cathode 5, and an ion-complexing material layer 6. The substrate 1 may be a glass substrate. The anode 2 may be a transparent conductive layer formed by coating the substrate 1 with indium tin oxide (ITO). The ITO layer (anode) may have a thickness of about 100 nm and an electric conductivity less than 20Ω. The HTL 3 is deposited on the anode (ITO layer) 2 by spin coating, and it may be made of PDOT:PSS (poly (ethylene dioxythiophene)-polystyrene sulfone acid). The HTL 3 may be formed to a thickness of about 50 nm by spin coating at 1000 rpm. The HTL 3 may have a thickness ranging from about 30 nm to about 150 nm. The substrate 1, including the anode 2 and HTL 3, is then heated on a heating plate at 200° C. for 10 minutes.

The ion-complexing material layer 6 is then formed by depositing crown ether on the HTL 3 by spin coating. A 0.5% solution (mass basis) of 18-crown-5 (1,4,7,0,13-pentaoxyazyclopentadekan) in acetic acid butylester (p.A.) may be utilized, and it may be spin-coated to a thickness of about 10 nm. Next, the substrate 1, the anode 2, the HTL 3, and the ion-complexing material layer 6 are heated at 100° C. for 10 minutes. Alternatively, the ion-complexing material layer 6 may be comprised of a complex-forming ionophore or of a zeolite. Further, the ion-complexing material layer 6 may have a thickness ranging from about 5 nm to about 15 nm.

The organic emissive layer 4 is then formed by depositing a solution of a luminescent polymer on the ion-complexing material layer 6 by spin coating. Polyfluorene or poly(phenylenvinylenes) may be used as the luminescent polymer. Anhydrous isoxylene may be used for a solvent of the solution. For example, a 1.5% polyfluorene solution may be spin-coated at 1600 rpm to a thickness of about 70 nm. The organic emissive layer 4 may have a thickness ranging from about 50 nm to about 120 nm. The substrate 1, the anode 2, the HTL 3, the ion-complexing material layer 6, and the organic emissive layer 4 are then heated on a heating plate at 160° C. for 30 minutes in an inert (nitrogen) gas atmosphere.

Next, the cathode 5 is formed with a multi-layered structure using thermal deposition. At least a portion of the cathode may include at least one of an alkali fluoride layer or an alkali earth fluoride layer. The alkali fluoride layer may be a lithium fluoride layer. A lithium fluoride layer having a thickness of about 1 nm and a calcium layer having a thickness of about 10 nm may be sequentially deposited using thermal deposition. A reflective metal contact layer may be deposited in a high vacuum condition using thermal deposition to obtain a complete active structure. Suitable metals for the reflective metal contact layer include aluminum, silver, ytterbium, calcium, and other like materials.

The structure is then sealed using another glass substrate for protection from impurities.

In this OLED, due to the ion-complexing material layer 6, migration of ions into the organic emissive layer 4, which happens as charged particles migrate in an electric field or particles diffuse according to a concentration gradient, may be prevented and/or suppressed. Consequently, by using the ion-complexing material layer 6, the efficiency (ratio of the amount of light emitted from the OLED to applied current) and durability (stability of the intensity of light emitted from the OLED in an operating period) of the OLED may be increased.

Figure 2:
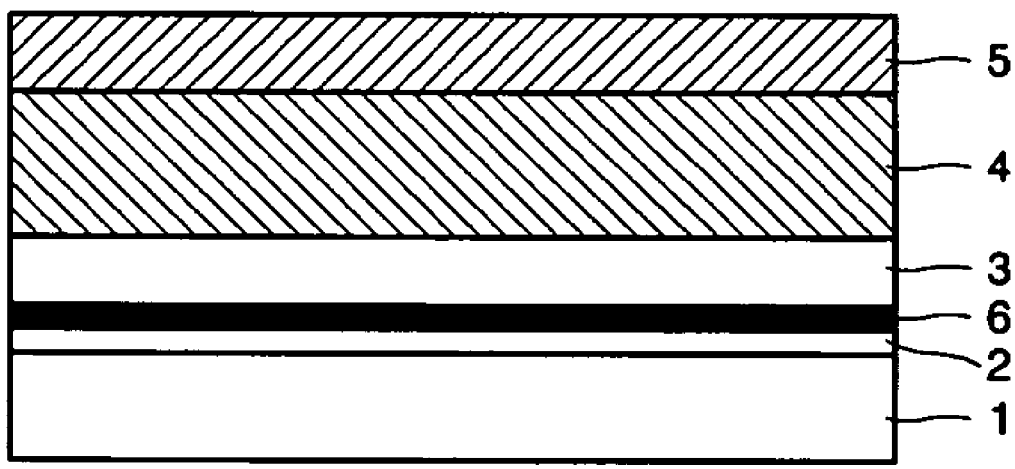
FIG. 2 shows an OLED according to a second exemplary embodiment of the present invention.

FIG. 2 illustrates an OLED according to a second exemplary embodiment of the present invention. The OLED of FIG. 2 includes a substrate 1, an anode 2, an ion-complexing material layer 6, an optional HTL 3, an organic emissive layer 4, and a cathode 5, which may be sequentially formed upon one another. Unlike the embodiment of FIG. 1, the ion-complexing material layer 6 is formed between the anode 2 and the HTL 3, instead of between the HTL 3 and the organic emissive layer 4.

Figure 3:
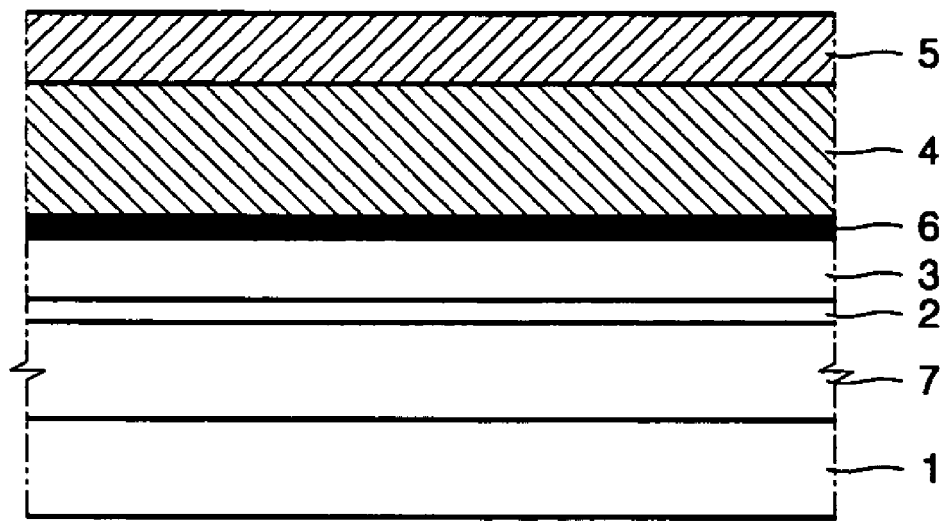
FIG. 3 and FIG. 4 show OLEDs according to third and fourth exemplary embodiments of the preset invention.
Figure 4:
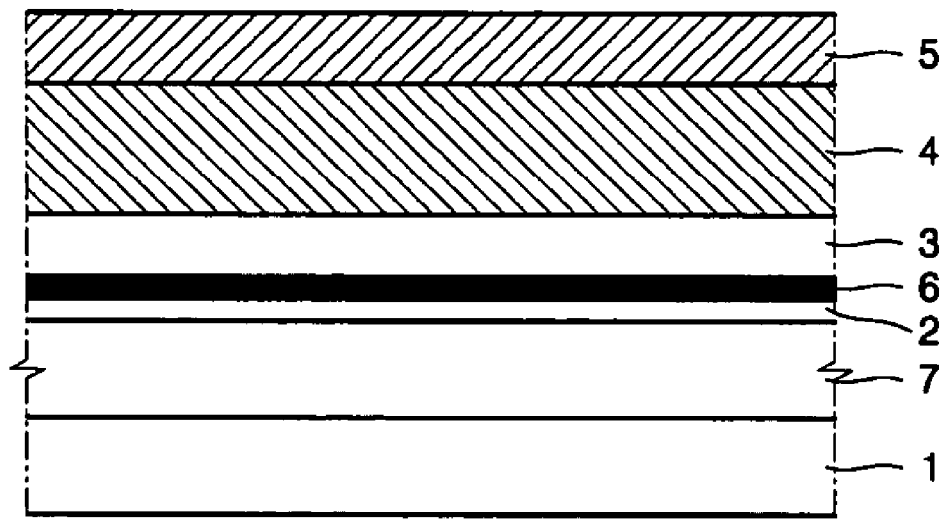

While the present invention has been particularly shown and described with reference to exemplary embodiments thereof, it will be understood by those of ordinary skill in the art that various changes in form and details may be made therein as long as the ion-complexing material layer is formed between the anode and the cathode. For example, although the anode 2 in FIGS. 1 and 2 is formed on a surface of the substrate 1, other layers, such as a layer 7 illustrated in FIGS. 3 and 4, which may include a thin film transistor used as a driving unit in an active matrix type OLED, may be formed between the substrate 1 and the anode 2. Other possible OLED layers include insulating layers, pixel defining layers, planarization layers, passivation layers, additional electrode layers, and other like layers. Further, while the layers are illustrated in the cross-sectional views as being horizontal, they may be formed in any shape, including having recessed portions, etched portions, openings, and upper and lower levels. Additionally, while the exemplary embodiments all show the cathode being formed above the anode, the anode may be formed above the cathode.

An OLED's actual efficiency is typically considerably lower than the ideal efficiency thereof. This is mostly attributed to the fact that charges are trapped so that a large number of electron-hole couples (exitons) cannot be generated even when sufficient amounts of electrons and holes are injected into the OLED. The efficiency of a conventional OLED is generally low because some electron-hole couples decompose while electron-hole coupling occurs to generate light. Some of the electron-hole couples decompose without causing radiation or electroluminescence. Heavy metal ions existing in polymeric layers of the OLED may cause the trapping of charges as well as non-radiative recombination.

Indium tin oxide (ITO) used for the anode may be a source of heavy metal ions. Other sources of heavy metal ions may be a metallic cathode and an organic material, for example, PDOT:PSS (poly(ethylene dioxythiophene)-polystyrene sulfone acid), and luminescent polymers such as PPV or PFO, which are used for hole conduction.

To prevent trapping of exitons or non-radiative decomposition of charges, the ion-complexing material layer is disposed between the anode and the cathode, preferably, between the anode and the emissive layer. Heavy metal ions, which reduce the efficiency of the OLED, are accumulated in the OLED through chemical reactions and restrict the mobility of charges.

Contaminants from the ion-complexing material layer may be accumulated in the layers of the OLED. However, this accumulation may not lead to significant reduction in efficiency and life span of the OLED.

In a display including the OLED of FIG. 1 or 2, maximum efficiency may be considerably increased. Compared with a pLED display that was experimentally produced in the same condition as an OLED display of the present invention, except that the ion-complexing material layer 6 according to the present invention was not formed in the pLED, the maximum efficiency of the OLED display may be 30–100% higher. As a result, the OLED display of the present invention may require a lower power input than a pLED display without an ion-complexing material layer.

Additionally, the efficiency of the pLED display using the present invention may be maximized at an initial voltage of 2–3V. However, in conventional pLED displays, the efficiency may slowly increase at a voltage higher than the initial voltage, and it may be maximized at a working voltage of 6–8 V. A high efficiency at a voltage of 3–5V, near the initial voltage, is an important factor for the energy balance of an active matrix type pLED monitor screen because pLED picture points (pixels) operate in that voltage range. Using the present invention, an input power for active matrix type pLED monitor screens may be reduced. A lower input power is also advantageous for battery-driven devices such as mobile phones.

Finally, the ion-complexing material layer 6 may prolong the life span of the pLED. For a display according to an exemplary embodiment of the present invention, the life span (defined as the time at which brightness decays to 50% of an initial brightness, which was 1000 cd/$m_2$ in the embodiment) may be increased to be 30% longer than conventional displays. Further, the operational stability of the pLED display element may be suitable for commercial applications.

It will be apparent to those skilled in the art that various modifications and variation can be made in the present invention without departing from the spirit or scope of the inven-

What is claimed is:

1. An organic light emitting device (OLED), comprising:
   an anode;
   a cathode;
   an organic emissive layer disposed between the anode and the cathode; and
   an ion-complexing material layer disposed between the anode and the cathode, wherein the ion-complexing material layer is distinct from the organic emissive layer.

2. The OLED of claim 1, wherein the ion-complexing material layer is disposed between the anode and the organic emissive layer.

3. The OLED of claim 2, further comprising a hole transport layer, wherein the hole transport layer is formed directly on the anode or directly on the ion-complexing layer.

4. The OLED of claim 1, wherein the ion-complexing material layer is comprised of a complex-forming ionophore, a crown ether, or a zeolite.

5. The OLED of claim 4, wherein the ion-complexing layer is between the anode and the organic emissive layer.

6. The OLED of claim 5, further comprising a hole transport layer, wherein the hole transport layer is formed directly on the anode or directly on the ion-complexing layer.

7. The OLED of claim 1, wherein the ion-complexing material layer has a thickness ranging from about 5 nm to about 15 nm.

8. The OLED of claim 7, wherein the ion-complexing layer is between the anode and the organic emissive layer.

9. The OLED of claim 8, further comprising a hole transport layer, wherein the hole transport layer is formed directly on the anode or directly on the ion-complexing layer.

10. The OLED of claim 3, wherein the hole transport layer is made of poly(ethylene dioxythiophene)-polystyrene sulfone acid at a thickness ranging from about 30 nm to about 150 nm.

11. The OLED of claim 1, wherein the organic emissive layer contains at least one of poly(phenylenvinylenes) or polyfluorenes.

12. The OLED of claim 11, wherein the ion-complexing layer is between the anode and the organic emissive layer.

13. The OLED of claim 12, further comprising a hole transport layer, wherein the hole transport layer is formed directly on the anode or directly on the ion-complexing layer.

14. The OLED of claim 1, wherein the organic emissive layer has a thickness ranging from about 50 nm to about 120 nm.

15. The OLED of claim 14, wherein the ion-complexing layer is between the anode and the organic emissive layer.

16. The OLED of claim 15, further comprising a hole transport layer, wherein the hole transport layer is formed directly on the anode or directly on the ion-complexing layer.

17. The OLED of claim 1, wherein the anode is made of indium tin oxide, and the cathode includes at least one layer made of at least one selected from the group consisting of aluminum, silver, ytterbium, or calcium.

18. The OLED of claim 1, wherein at least a portion of the cathode includes at least one of an alkali fluoride layer or an alkali earth fluoride layer.

19. The OLED of claim 18, wherein the alkali fluoride layer is a lithium fluoride layer.

20. The OLED of claim 1, further comprising two substrates, wherein the OLED is sealed between the two substrates.

21. A display using an organic light emitting device, comprising:
    an anode;
    a cathode;
    an organic emissive layer disposed between the anode and the cathode; and
    an ion-complexing material layer disposed between the anode and the cathode, wherein the ion-complexing material layer is distinct from the organic emissive layer.

22. The display of claim 21, wherein the ion-complexing material layer is disposed between the anode and the organic emissive layer.

23. The display of claim 22, further comprising a hole transport layer, wherein the hole transport layer is formed directly on the anode or directly on the ion-complexing layer.

24. The display of claim 21, wherein the ion-complexing material layer is comprised of a complex-forming ionophore, a crown ether, or a zeolite.

25. The display of claim 24, wherein the ion-complexing layer is between the anode and the organic emissive layer.

26. The display of claim 25, further comprising a hole transport layer, wherein the hole transport layer is formed directly on the anode or directly on the ion-complexing layer.

27. The display of claim 21, wherein the ion-complexing material layer has a thickness ranging from about 5 nm to about 15 nm.

28. The display of claim 27, wherein the ion-complexing layer is between the anode and the organic emissive layer.

29. The display of claim 28, further comprising a hole transport layer, wherein the hole transport layer is formed directly on the anode or directly on the ion-complexing layer.

30. The display of claim 23, wherein the hole transport layer is made of poly(ethylene dioxythiophene)-polystyrene sulfone acid at a thickness ranging from about 30 nm to about 150 nm.

31. The display of claim 21, wherein the organic emissive layer contains at least one of poly(phenylenvinylenes) or polyfluorenes.

32. The display of claim 31, wherein the ion-complexing layer is between the anode and the organic emissive layer.

33. The display of claim 32, further comprising a hole transport layer, wherein the hole transport layer is formed directly on the anode or directly on the ion-complexing layer.

34. The display of claim 21, wherein the organic emissive layer has a thickness ranging from about 50 nm to about 120 nm.

35. The display of claim 34, wherein the ion-complexing layer is between the anode and the organic emissive layer.

36. The display of claim 35, further comprising a hole transport layer, wherein the hole transport layer is formed directly on the anode or directly on the ion-complexing layer.

37. The display of claim 21, wherein the anode is made of indium tin oxide, and the cathode includes at least one layer made of at least one selected from the group consisting of aluminum, silver, ytterbium, or calcium.

38. The display of claim 21, wherein at least a portion of the cathode includes at least one of an alkali fluoride layer or an alkali earth fluoride layer.

39. The display of claim 38, wherein the alkali fluoride layer is a lithium fluoride layer.

40. The display of claim 21, further comprising two substrates, wherein the OLED is sealed between the two substrates.

* * * * *